(12) United States Patent
Chan et al.

(10) Patent No.: US 6,902,619 B2
(45) Date of Patent: Jun. 7, 2005

(54) LIQUID PHASE EPITAXY

(75) Inventors: Yuen Chuen Chan, Singapore (SG); Xiangjun Mao, Singapore (SG)

(73) Assignee: NTU Ventures PTE. Ltd., Singapore (SG)

( * ) Notice: Subject to any disclaimer, the term of this patent is extended or adjusted under 35 U.S.C. 154(b) by 0 days.

(21) Appl. No.: 09/894,186

(22) Filed: Jun. 28, 2001

(65) Prior Publication Data

US 2003/0010277 A1 Jan. 16, 2003

(51) Int. Cl.[7] .............................................. C30B 19/00
(52) U.S. Cl. ........................... 117/54; 117/56; 117/57; 117/60
(58) Field of Search ............................ 117/54, 56, 57, 117/60

(56) References Cited

U.S. PATENT DOCUMENTS

| | | | | |
|---|---|---|---|---|
| 3,858,553 A | * | 1/1975 | Scheel | 118/421 |
| 3,933,573 A | * | 1/1976 | Dugger | 117/78 |
| 4,001,076 A | * | 1/1977 | Robinson et al. | 117/65 |
| 4,012,242 A | * | 3/1977 | Matare | 117/56 |
| 4,142,924 A | * | 3/1979 | Hsieh | 117/61 |
| 4,315,477 A | | 2/1982 | Wang et al. | 118/64 |
| 4,519,871 A | * | 5/1985 | Cook | 117/56 |
| 4,521,272 A | * | 6/1985 | Gault | 117/83 |
| 4,594,128 A | | 6/1986 | Cook | 156/622 |
| 4,692,194 A | * | 9/1987 | Nishizawa | 117/56 |
| 4,876,210 A | * | 10/1989 | Barnett et al. | 117/58 |
| 4,906,325 A | * | 3/1990 | Bernardi | 117/55 |
| 5,167,759 A | * | 12/1992 | Omino | 117/83 |
| 5,173,087 A | * | 12/1992 | Kroes et al. | 117/68 |
| 5,375,557 A | | 12/1994 | Anderson | 117/203 |
| 5,401,684 A | * | 3/1995 | Yamada et al. | 438/47 |
| 5,503,103 A | * | 4/1996 | Bauser et al. | 117/56 |
| 5,637,531 A | * | 6/1997 | Porowski et al. | 117/89 |

FOREIGN PATENT DOCUMENTS

EP    0 922 488 A2 *    6/1999    ............. B01J/2/00

OTHER PUBLICATIONS

Abstract of oral presentation at Taiwan Symposium (Jul. 26th–28th, 2000).
Technical Symposium Program entitled Photonics Taiwan Jul. 26–28, 2000.
"New Concept Technology Pressure–Variation Liquid Phase Epitaxy", Xian–jun Maao et al., Jul. 2000.
Study of Liquid Phase Epixtaxial Growth of Antimonide Compounds, Mao Xiang–jun, 2000.
Publication Solid–Liquid Equilibria For Quaternary Solid . . . , A.S. Jordan et al. May 17, 1974.
IEEE Journal of Quantum Electronics, vol. QE–23 No. 6, Jun. 19897 "InGaSbAs Injection Lasers".

* cited by examiner

Primary Examiner—Nadine G. Norton
Assistant Examiner—Matthew Song
(74) Attorney, Agent, or Firm—Perman & Green, LLP (57) ABSTRACT

The invention provides a method of growing semiconductor epitaxial layers on a substrate comprising the steps of     providing a substrate, providing at least a first growth solution and optionally one or more further growth solutions, and (i) exposing the substrate to the first growth solution, the growth solution being under a supersaturated condition such that a first layer grows on the surface of the substrate; and, (ii) optionally exposing the substrate to one or more further growth solutions, the further growth solutions being under a supersaturated condition such that one or more further layers grow on the surface of the first layer; and (iii) varying the pressure of the system to change the degree of supersaturation of the first growth solution or one or more further growth solutions to affect the growth of the first layer or one or more further layers.

13 Claims, 8 Drawing Sheets

Atomic fraction $\chi^l_{Ga}$ in melt for $In_{0.1}Ga_{0.9}As_{0.087}Sb_{0.913}$ growth on GaSb (100) substrate at 550°C as a function of pressure.

Fig.5.

Atomic fraction $\chi^l_{In}$ in melt for $In_{0.1}Ga_{0.9}As_{0.087}Sb_{0.913}$ growth on GaSb (100) substrate at 550°C as a function of pressure.

Fig.6.

Atomic fraction $\chi^l_{As}$ in melt for $In_{0.1}Ga_{0.9}As_{0.087}Sb_{0.913}$ growth on GaSb (100) substrate at 550°C as a function of pressure.

Fig.7.

Atomic fraction $\chi^l_{Sb}$ in melt for $In_{0.1}Ga_{0.9}As_{0.087}Sb_{0.913}$ growth on GaSb (100) substrate at 550°C as a function of pressure.

LIQUID PHASE EPITAXY

FIELD OF THE INVENTION

This invention relates to the growth of semiconductor epitaxial layers on a substrate.

BACKGROUND TO THE INVENTION

It is common practice to grow compound semiconductor epitaxial layers on a substrate by liquid phase epitaxy (LPE). The basis of LPE growth is the production of supersaturation in a growth solution, such that the deposition of solid material occurs onto the substrate. The temperature of the substrate and the growth solution is used to control deposition of solid material onto the substrate.

In the step cooling technique, the substrate and the growth solution are cooled to a temperature below the saturation temperature of the solution. The substrate is slid under the growth solution and a constant temperature is maintained during the growth period. The growth is terminated by sliding the substrate out of the solution.

In the equilibrium cooling technique, both substrate and growth solution are at the saturation temperature of the growth solution. Growth begins when the substrate is brought into contact with the growth solution and both are cooled at a uniform rate. The growth is terminated by sliding the substrate out of the solution.

The supercooling technique is a combination of the step cooling and equilibrium cooling techniques. The substrate is brought into contact with the solution when both are at a temperature below the saturation temperature of the growth solution. The growth solution and the substrate are further cooled during growth.

Thus both the growth rate and the material composition of the layers are controlled by temperature. Heat generation and removal are very slow processes and so it is generally very difficult to obtain temperature uniformity and responsive temperature variation at the same time using LPE techniques. This limits the quality of the structures produced as well as the flexibility in designing complicated growth recipes for novel epitaxial layer structures. For example, the growth temperature may be either kept constant or lowered but is never raised nor raised and lowered in a varying profile.

U.S. Pat. No. 4,594,128 describes an apparatus and method for the low cost growth of an epitaxial layer on a substrate from a solution. Temperature is used to control the deposition of solid material onto the substrate and therefore this procedure suffers from the problems of slow heat generation and heat removal, and temperature uniformity disclosed above. Gas pressure is used to move growth solution into contact with the substrate.

U.S. Pat. No. 4,315,477 and U.S. Pat. No. 5,375,557 are directed towards the production of mercury cadmium telluride (HgCdTe) epitaxial layers. The growth chambers are maintained at a high pressure to reduce the vaporisation of the components from the growth source. In both cases, the formation of epitaxial layers is induced by reducing the temperature of the growth solution to induce crystallisation on a substrate, encountering the problems discussed above.

It would be advantageous to have an LPE system in which it is easy to control supersaturation and the composition of the layers. In addition, it would be advantageous to be able to implement iterative growth easily and to have greater flexibility in designing the growth process.

SUMMARY OF THE INVENTION

According to the invention we provide a method of growing semiconductor epitaxial layers on a substrate comprising the steps of providing a substrate, providing at least a first growth solution and optionally one or more further growth solutions, and (i) exposing the substrate to the first growth solution, the growth solution being under a supersaturated condition such that a first layer grows on the surface of the substrate; and, (ii) optionally exposing the substrate to one or more further growth solutions, the further growth solution or solutions being under a supersaturated condition such that one or more further layers grow on the surface of the first layer; and (iii) varying the pressure of the system to change the degree of supersaturation of the first growth solution or one or more further growth solutions to affect the growth of the first layer or one or more further layers.

Thus in the invention we use variation in pressure to control the degree of supersaturation of growth solutions. We describe this technique as "variable pressure LPE".

Variable pressure LPE has several advantages over standard LPE.

Control of supersaturation is facilitated in pressure variable LPE as it is pressure of the growth solution which is used to control supersaturation. Controlling pressure is a developed technique, and the pressure can be changed rapidly and accurately.

It is also easy to control the solid layer ingredients in variable pressure LPE. The phase diagram as a function of pressure is monotonous and quasi-linear, whilst in contrast, the phase diagram as a function of temperature in standard LPE is complicated and non-monotonous. Monotonous in this context means that the function is single valued, i.e. one atomic fraction value corresponds to one value of the growth pressure.

Since the pressure can be controlled very rapidly in variable pressure LPE, it is possible to grow graded layers whereby the composition is varied across a particular epitaxial layer. The profile of the material composition and hence the band gap will be dependent on the manner in which the pressure is varied.

Furthermore, it is easy to implement iterative growth using variable pressure LPE. The pressure can be controlled as desired in the course of a growth process using variable pressure LPE which brings about great flexibility in the growth process. This results in better quality of the epitaxial layers.

By, realising supersaturation in the growth solution by changing the pressure, supersaturation is much easier to control. The pressure can be changed rapidly and accurately using vacuum pumps, pressure controllers and vacuum gauges.

Standard LPE equipment can be used to implement variable pressure LPE growth with some simple modifications to allow the pressure to be varied.

DETAILED DESCRIPTION OF THE INVENTION

According to the invention, we provide a method for growing a semiconductor epitaxial layer or layers over a substrate.

The epitaxial layers are deposited from a growth solution (also called a growth source or melt) containing the desired materials. Material is deposited from the growth solution onto the substrate when the substrate is brought into contact with a supersaturated growth solution.

The supersaturation of the growth solution or solutions is controlled by varying the pressure of the growth solution. As the pressure of the growth solution can be changed rapidly and controlled accurately, the composition of the epitaxial layers can be controlled using the pressure.

Figure 1:
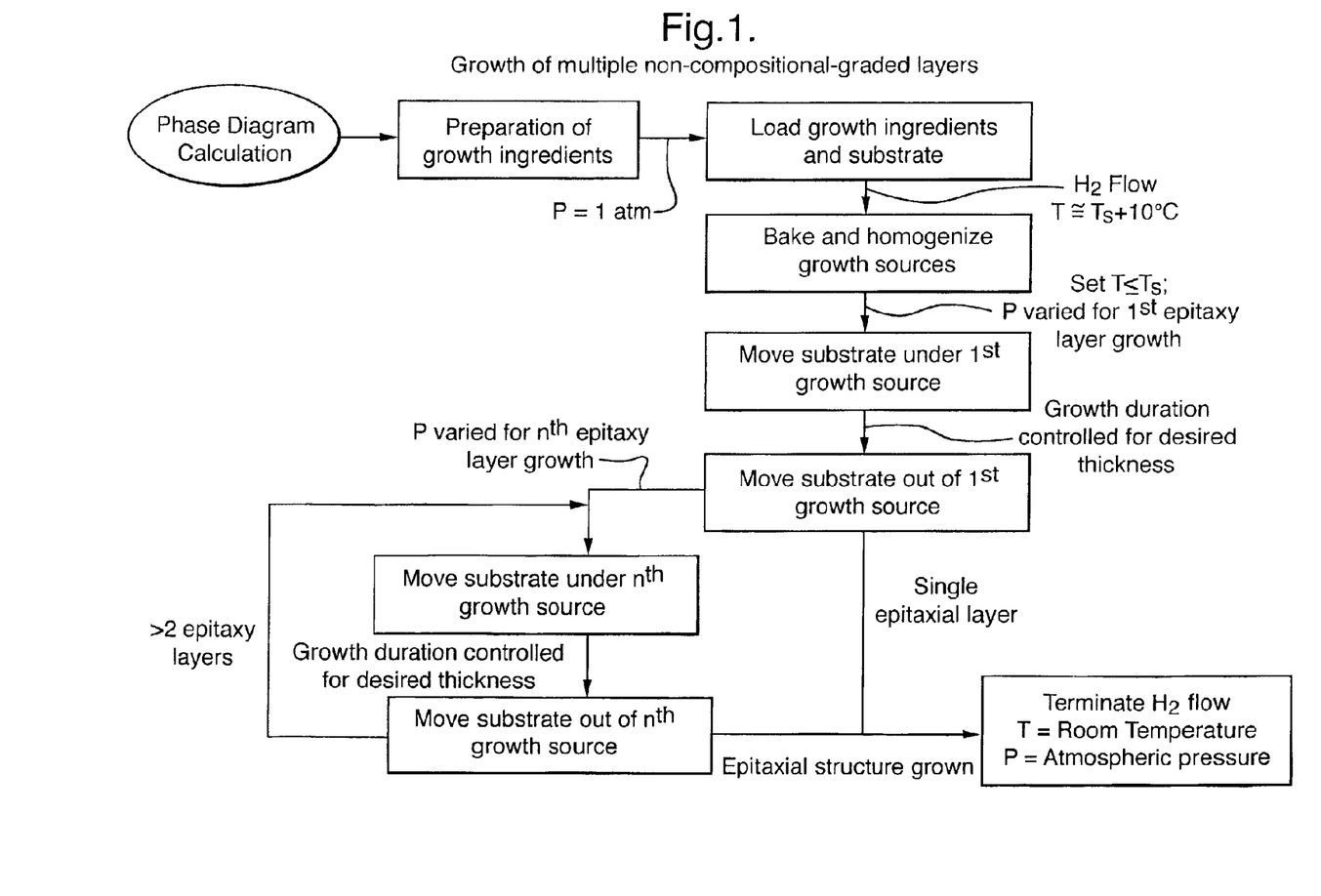
FIG. 1 is a schematic illustration of a first method according to the invention.

The pressure may be varied between the growth of layers. A schematic illustration of a method for this is shown in FIG. 1.

The growth ingredients for different layers are prepared, their exact weights having been determined using phase diagram calculations. The furnace chamber is then brought to atmospheric pressure and the growth ingredients for the different layers and the substrate placed in the graphite boat before loading the boat into the furnace chamber. The chamber is then sealed.

A flow of hydrogen gas is started and the temperature of the furnace chamber ramped up above the saturation temperature of the growth solution in order to bake and homogenise the growth solution. Preferably the temperature is between 5 and 30° C. above the saturation temperature. More preferably, the temperature is between 8 and 20° C. above the saturation temperature, for example 10° C. above the saturation temperature.

The temperature of the furnace chamber is then lowered to the desired growth temperature. This may be the saturation temperature or below the saturation temperature of the growth solution. Preferably, the temperature is between 0 and 15° C. below the saturation temperature, for example 5° C. below the saturation temperature. Once an equilibrium state has been reached at this temperature, the pressure of the growth solution is changed to the desired value for growth of the first epitaxial layer.

The graphite boat containing the substrate is moved under the first growth solution and contacted with it for sufficient time to grow a layer of the desired thickness. The substrate in the graphite boat is then moved out of contact with the growth solution.

When growing a single epitaxial layer, the temperature of the furnace is returned to room temperature, the pressure returned to atmospheric pressure and the hydrogen gas flow terminated. When growing multiple epitaxial layers, the pressure is changed to the desired value for growth of the second epitaxial layer. This may involve either raising or lowering the pressure. The substrate is then brought into contact with the second growth solution for sufficient time in order to grow a layer of the desired thickness. For growing more than two epitaxial layers, the steps of (i) changing the pressure,
(ii) contacting the substrate with a growth solution,
(iii) growing an epitaxial layer of the desired thickness
(iv) removing the substrate from contact with the growth solution are repeated until the desired layers have been grown. The temperature of the furnace chamber is lowered to room temperature, the pressure returned to atmospheric pressure and the flow of hydrogen terminated.

Figure 2:
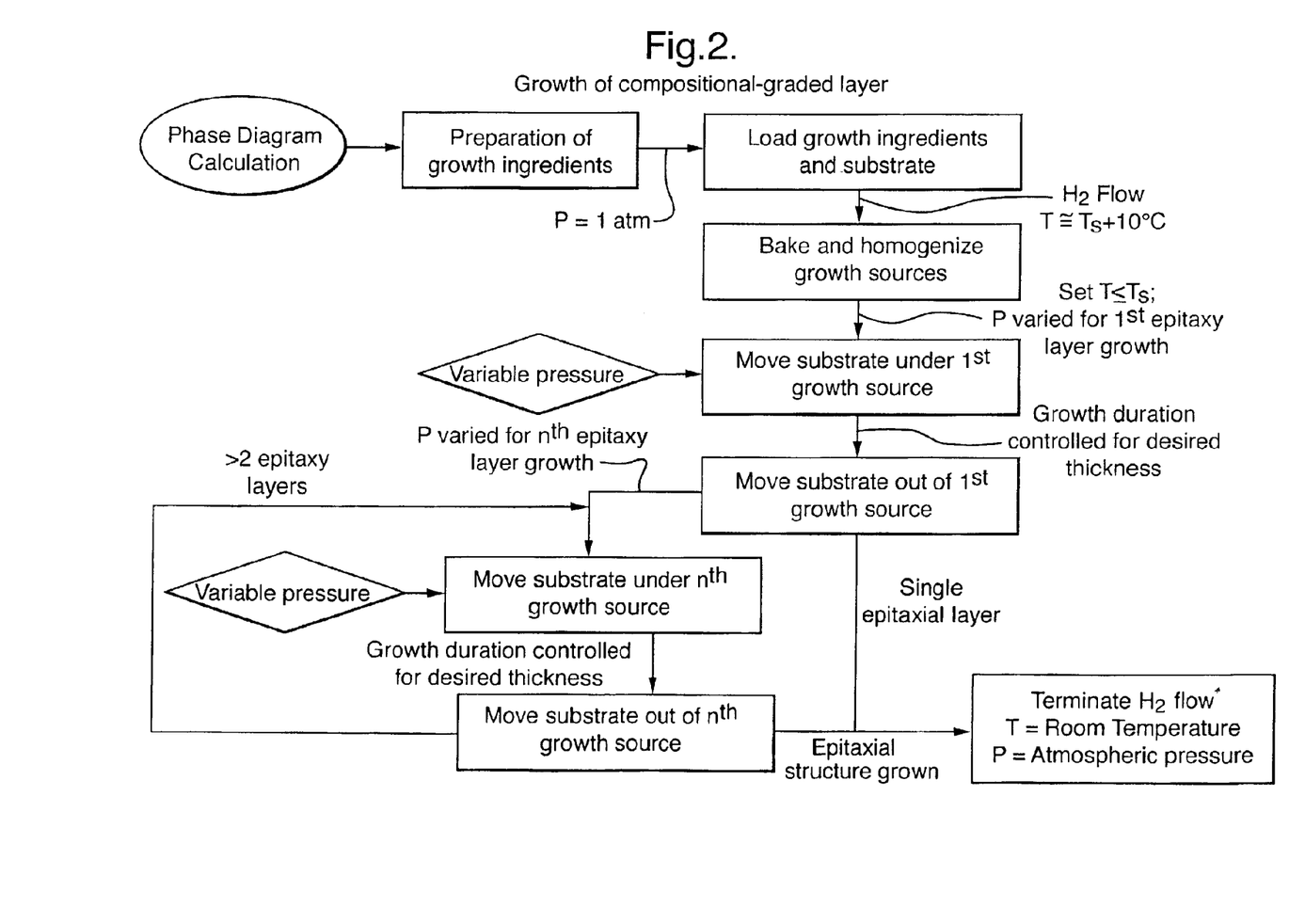
FIG. 2 is a schematic illustration of a further method according to the invention.

FIG. 2 is a schematic illustration of a method in which compositionally graded layers are grown.

The growth ingredients are first prepared, their exact weights having been determined using phase diagram calculations. The furnace chamber is brought to atmospheric pressure. The growth ingredients and the substrate are loaded into the graphite boat before loading the graphite boat into the furnace chamber and sealing the chamber.

A flow of hydrogen gas is started and the temperature of the furnace chamber ramped up above the saturation temperature of the growth solution in order to bake and homogenise the growth solution. Preferably the temperature is between 5 and 30° C. above the saturation temperature. More preferably, the temperature is between 8 and 20° C. above the saturation temperature, for example 10° C. above the saturation temperature.

The temperature of the furnace chamber is then lowered to the desired growth temperature. This may be the saturation temperature or below the saturation temperature of the growth solution. Preferably, the temperature is between 0 and 15° C. below the saturation temperature, for example 5° C. below the saturation temperature. Upon reaching an equilibrium state at this temperature, the pressure is varied to the desired value and the substrate contacted with the growth solution in order to grow an epitaxial layer on the substrate. During growth of the epitaxial layer the pressure is varied, producing a compositionally graded layer.

When a layer of the desired thickness has been grown, the substrate is removed from contact with the growth solution. If a single epitaxial layer is being grown, the temperature of the furnace is returned to room temperature, the pressure returned to atmospheric pressure and the flow of hydrogen is then terminated. If more than one epitaxial layer is to be grown, the pressure is changed to the desired value for the growth of the next layer. The substrate is then contacted with the next growth solution and the pressure varied during growth of the epitaxial layer. The substrate is then moved out of contact with this growth solution and the steps of (i) changing the pressure,
(ii) contacting the substrate with the growth solution,
(iii) varying the pressure during epitaxial growth and
(iv) moving the substrate out of contact with the growth solution are repeated until the desired layers are grown. The temperature of the furnace is then returned to room temperature, the pressure of the furnace returned to atmospheric pressure and the flow of hydrogen gas terminated.

It is possible according to the invention to combine compositionally-graded layers with other layers. Thus the process of the invention may be used to grow two or more different compositionally-graded layers, or one or more compositionally-graded layers together with one or more single-composition layers. These layers may be grown in any order.

Figure 3:
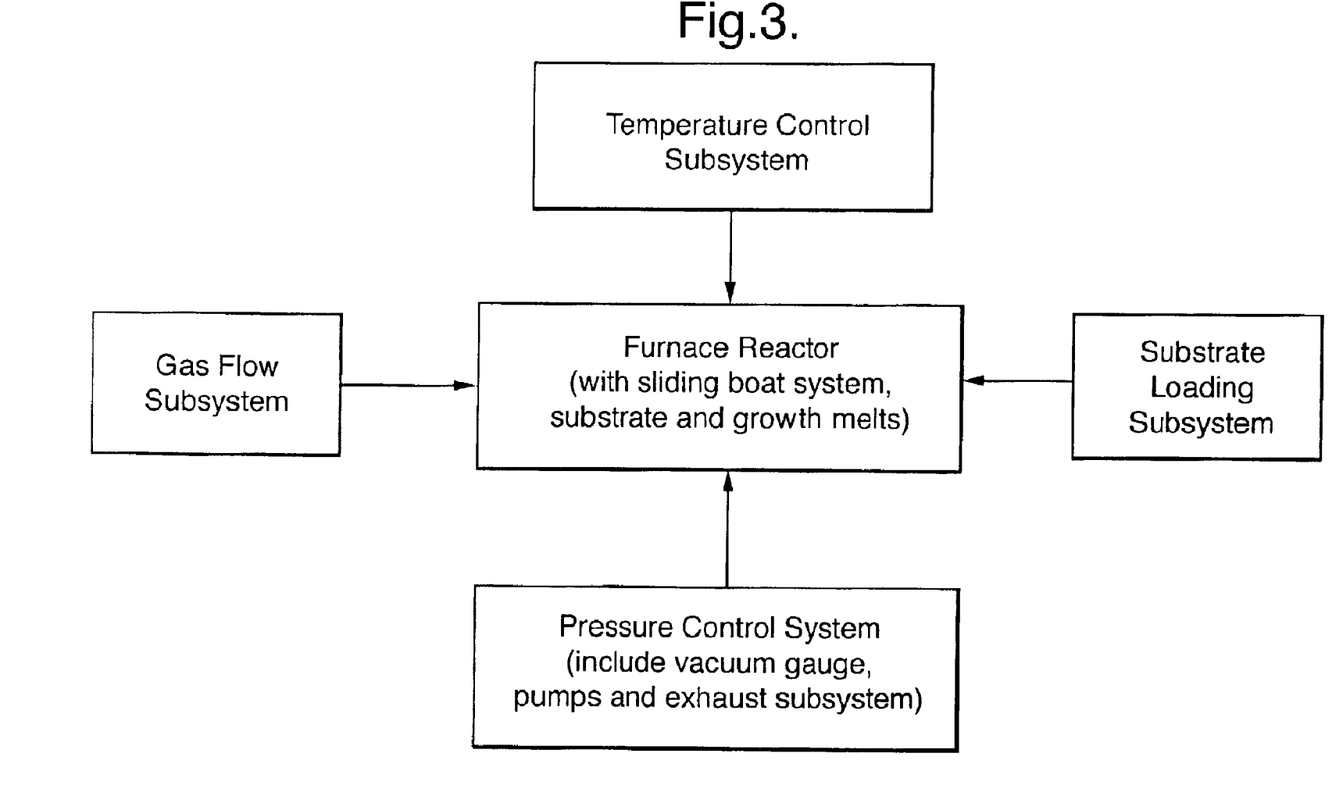
FIG. 3 shows a schematic illustration of a system in which the method of the invention may be implemented.

FIG. 3 illustrates the components of a system that can be used to carry out variable pressure LPE. The system generally comprises a furnace, temperature controller, a graphite boat to house the growth solutions and substrate, a pressure control system and a hydrogen flow system. Hydrogen gas is used to prevent oxide formation. The substrate for epitaxial growth is placed in the graphite boat on, a slider, and is moved below a growth solution to grow an epitaxial layer.

The LPE furnace should have high temperature stability and flat temperature profiles across the graphite boat housing the growth solutions. The temperature profile of the furnace should have a reasonably long region in the centre where the temperature is constant to within ±1° C. The length of this flat zone region depends on the dimensions of the graphite boat used. In addition, the temperature ramping must be carried out accurately according to the desired profile. Typical ramp down rates are between 0.3 and 0.5° C./min. The temperature of the growth solution should be set to a value suitable for epitaxial growth at the selected growth pressure. Typically the temperature of a growth solution will be between 500 and 750° C., depending on the type of compound semiconductor material being grown, although temperatures above and below this range may be used if appropriate.

Generally it is preferred that the temperature be substantially constant throughout the process, although it is possible in the invention to vary the temperature during and between growth of layers.

Typically the pressure of a growth solution during epitaxial growth will be between atmospheric pressure and a pressure of $10^{-4}$ Torr.

The thickness of an epitaxial layer depends on the length of time that the substrate is in contact with the growth solution. Typically a substrate will be in contact with a growth solution for between 1 second and 3 minutes in order to grow an epitaxial layer of suitable thickness.

The components of the growth solution may be supplied in any suitable form, for instance as pure metal or polycrystalline compounds. They are generally loaded in solid form and melted to form a homogenised solution on heating. For example, to prepare a growth source for InGaAsSb, it is possible to use pure Ga metal mixed with polycrystalline InAs, GaAs and GaSb.

The substrate can be any III–V compound semiconductor wafer, such as gallium arsenide (GaAs), indium phosphide (InP), gallium antimonide (GaSb) or indium arsenide (InAs).

The principle of VP-LPE is to realise supersaturation in the growth solution by changing the growth pressure. Among the various thermodynamical parameters related to the phase diagram, melting point is very sensitive to pressure variation. According to the Clapeyron equation, $$\frac{dp}{dT} = \frac{\Lambda_m}{T(V_{mol}^l - V_{mol}^s)},$$

when the pressure p varies, the melting point T will change, which consequently affects the supersaturation of the liquid. Here $V_{mol}^s$ is the molar volume of the solid, $V_{mol}^l$ is the molar volume of the liquid and $\Lambda_m$ is the molar heat of sublimation.

The thermodynamic basis of LPE growth is the phase diagram that provides information on the composition of the solution and the solid in equilibrium as a function of temperature. Most calculations of III–V compound semiconductor phase diagrams have been based on a regular solution model of the liquid and solid phases. There exist a number of equations that link up the various thermodynamical parameters for the determination of phase diagrams. For example, Jordan and Ilegems (Jordan, A. S., Ilegems, M., *J. Phys. Chem. Solids*, 36, 329, 1975) showed that the phase diagram of a quaternary with mixing on both sublattices, as in $A^{III}_x B^{III}_{1-x} C^V_y D^V_{1-y}$, can be obtained from the following equations:

$$\Delta S_{AC}^f (T_{AC}^f - T) + RT\ln 4x_A^l \frac{x_C^l}{xy} = M_{AC}^l + \alpha_{AB}^s(1-x)^2 + \alpha_{CD}^s(1-y)^2 - \alpha_x(1-x)(1-y)$$

$$\Delta S_{AD}^f (T_{AD}^f - T) + RT\ln 4x_A^l \frac{x_D^l}{x(1-y)} = M_{AD}^l + \alpha_{AB}^s(1-x)^2 + \alpha_{CD}^s y^2 + \alpha_x(1-x)y$$

$$\Delta S_{BC}^f (T_{BC}^f - T) + RT\ln 4x_B^l \frac{x_C^l}{(1-x)y} = M_{BC}^l + \alpha_{AB}^s x^2 + \alpha_{CD}^s(1-y)^2 - \alpha_x x(1-y)$$

$$\Delta S_{BD}^f (T_{BD}^f - T) + RT\ln 4x_B^l \frac{x_D^l}{(1-x)(1-y)} = M_{BD}^l + \alpha_{AB}^s x^2 + \alpha_{CD}^s y^2 - \alpha_x xy$$

where $$\alpha_{AB}^s = y\alpha_{AC-BC}^s + (1-y)y\alpha_{AD-AD}^s$$

$$\alpha_{CD}^s = x\alpha_{AC-AD}^s + (1-x)y\alpha_{BC-BD}^s$$

$$\alpha_x = \Delta S_{AD}^f (T_{AD}^f - T) + \Delta S_{BC}^f (T_{BC}^f - T) - \Delta S_{AC}^f (T_{AC}^f - T) - \Delta S_{BD}^f (T_{BD}^f - T) + \frac{1}{2}(\alpha_{AC}^l + \alpha_{BD}^l - \alpha_{BC}^l - \alpha_{AD}^l)$$

$$M_{AC}^l = \alpha_{AC}^l \{1/2 - x_A^l(1 - x_C^l) - x_C^l(1 - x_A^l)\} + (\alpha_{AB}^l x_B^l + \alpha_{AD}^l x_D^l)(2x_A^l - 1) + (\alpha_{AB}^l x_B^l + \alpha_{AD}^l x_D^l)(2x_C^l - 1) + 2\alpha_{BD}^l x_B^l x_D^l$$

$$M_{AD}^l = \alpha_{AD}^l \left\{\frac{1}{2} - x_A^l(1 - x_D^l) - x_D^l(1 - x_A^l)\right\} + (\alpha_{AB}^l x_B^l + \alpha_{AC}^l x_C^l)(2x_A^l - 1) + (\alpha_{BD}^l x_B^l + \alpha_{CD}^l x_C^l)(2x_D^l - 1) + 2\alpha_{BC}^l x_B^l x_C^l$$

$$M_{BC}^l = \alpha_{BC}^l \left\{\frac{1}{2} - x_B^l(1 - x_C^l) - x_C^l(1 - x_B^l)\right\} + (\alpha_{AB}^l x_A^l + \alpha_{BD}^l x_D^l)(2x_B^l - 1) + (\alpha_{AC}^l x_A^l + \alpha_{CD}^l x_D^l)(2x_C^l - 1) + 2\alpha_{AD}^l x_A^l x_D^l$$

-continued $$M_{BD}^l = \alpha_{BD}^l \left\{ \frac{1}{2} - x_B^l(1 - x_D^l) - x_D^l(1 - x_B^l) \right\} +$$
$$(\alpha_{AB}^l x_A^l + \alpha_{BC}^l x_C^l)(2x_B^l - 1) +$$
$$(\alpha_{AD}^l x_A^l + \alpha_{CD}^l x_C^l)(2x_D^l - 1) + 2\alpha_{AC}^l x_A^l x_C^l$$

Here, $X_A^l$ denotes the mole fraction of component A in the liquid phase, $\Delta S_{AB}^f$ is the entropy of fusion of compound AB, $T_{AB}^f$ is the melting point of AB, R is the gas constant, $\alpha_{AB}^l$ is the interaction parameter in the liquid phase for AB, $\alpha_{AB}^s$ is the interaction parameter in the solid phase, T is the temperature and x and y are the solid mole fractions.

The phase diagrams for different materials are calculated by solving the above equations involving the interaction parameters and mole fractions simultaneously.

In our research work, we have converted the computation into an optimisation problem. We can form an optimisation function, which can be written as follows for the quaternary materials:

$$F(x_A^l, x_B^l, x_C^l) = \left\{ \Delta S_{AC}^f(T_{AC}^f - T) + RT\ln\frac{4x_A^l x_C^l}{xy} - M_{AC}^l - \alpha_{AB}^s(1-x)^2 - \alpha_{CD}^s(1-y)^2 + \alpha_x(1-x)(1-y) \right\}^2 +$$
$$\left\{ \Delta S_{AD}^f(T_{AD}^f - T) + RT\ln 4x_A^l \frac{x_D^l}{x(1-y)} - M_{AD}^l - \alpha_{AB}^s(1-x)^2 - \alpha_{CD}^s y^2 + \alpha_x(1-x)y \right\}^2 +$$
$$\left\{ \Delta S_{BC}^f(T_{BC}^f - T) + RT\ln 4x_B^l \frac{x_C^l}{(1-x)y} - M_{BC}^l - \alpha_{AB}^s x^2 - \alpha_{CD}^s(1-y)^2 + \alpha_x x(1-y) \right\}^2$$

with $$x_A^l + x_B^l + x_C^l + x_D^l = 1$$

The problem is solved by searching for an optimisation solution where the value of $F(x_A^l, x_B^l, x_C^l)$ is the smallest.

There are a number of methods to solve such a least square minimisation problem, and we have selected the Levenberg-Marquardt Method as it is the most efficient for such iterations.

With a constant temperature in VP-LPE, the supercooling state will be related to the growth pressure. Since pressure is easy to control, the supercooling state can be changed rapidly and precisely. Theoretically, devices with more complicated structures can be grown with VP-LPE.

EXAMPLE 1

The phase diagrams of the quaternary InGaAsSb are calculated based on the thermodynamic parameters of Dolginov (Drakin, A. E., Eliseev, P. G., Sverdlov, B. N., Bochkarev, A. E., Dolginov, L. M., Duzhinina, L. V., *Journal of Quantum Electronics*, 23, 1089–1094, 1987). To simplify the calculations, we assume that the relation between the melting point and the pressure is given by $$T(p) = T_o - 30 \times p \quad (0 \text{ atm} \leq p \leq 1 \text{ atm})$$

where $T_o$ denotes the melting point at standard atmospheric pressure, T(p) denotes the melting point at pressure p (atm), and the parameter 30 is obtained from growth experiments. Using this simplification, we obtained the phase diagrams of the quaternary with a Ga-rich source.

Taking $In_{0.1}Ga_{0.9}As_{0.087}Sb_{0.913}$ as an example of a lattice-matched quaternary to GaSb, we have worked out the phase diagram at 550° C. as a function of the growth pressure. The results are similar to those of InAsSb ternary and are illustrated in FIGS. 4 to 7.

Figure 4:
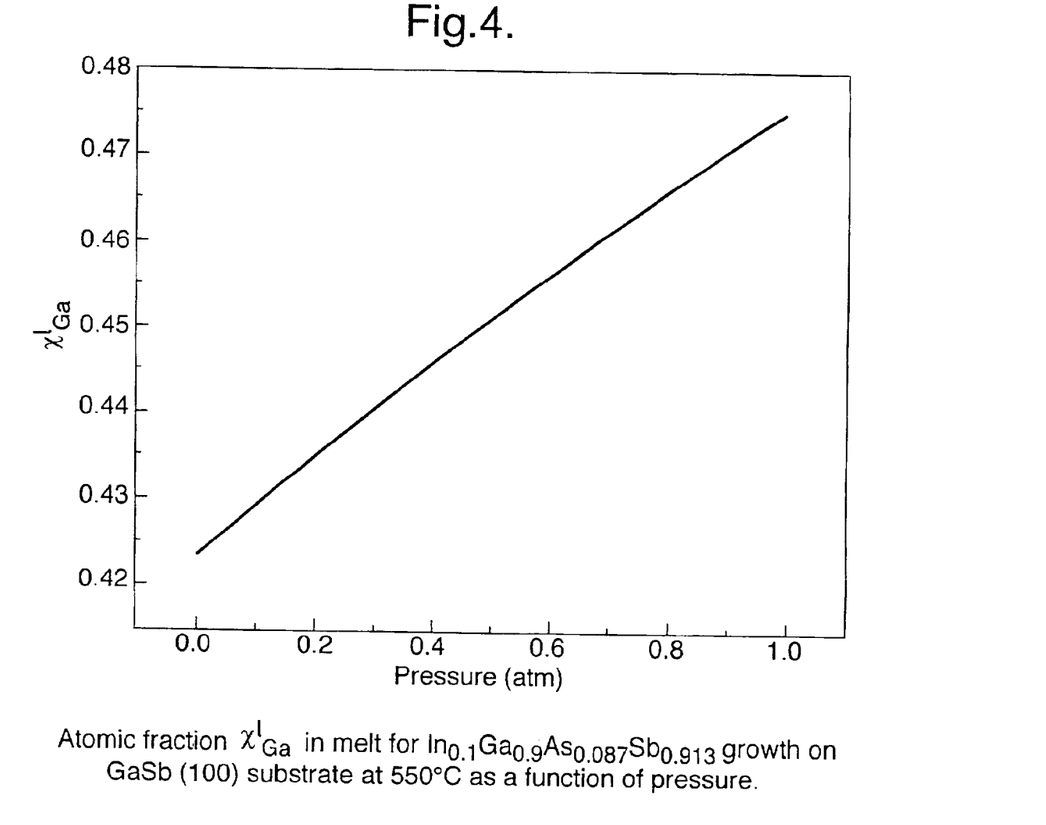
FIGS. 4 to 7 illustrate relationships between composition and pressure for a saturated solution of the quaternary InGaAsSb.
Figure 5:
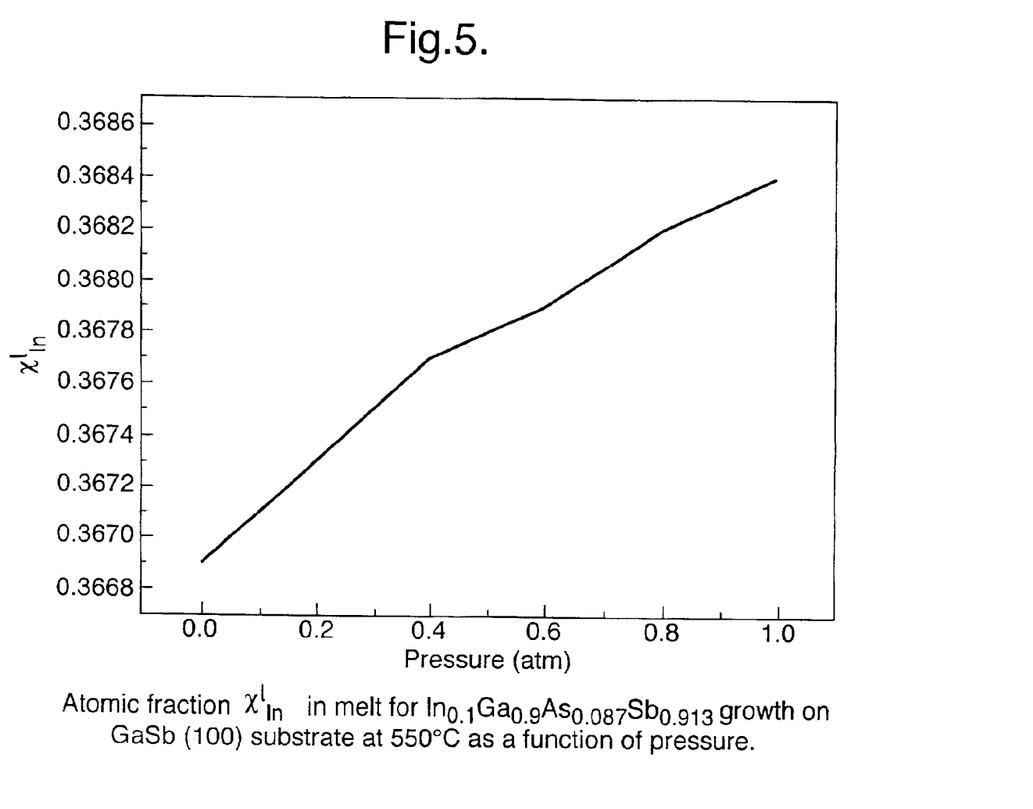
Figure 6:
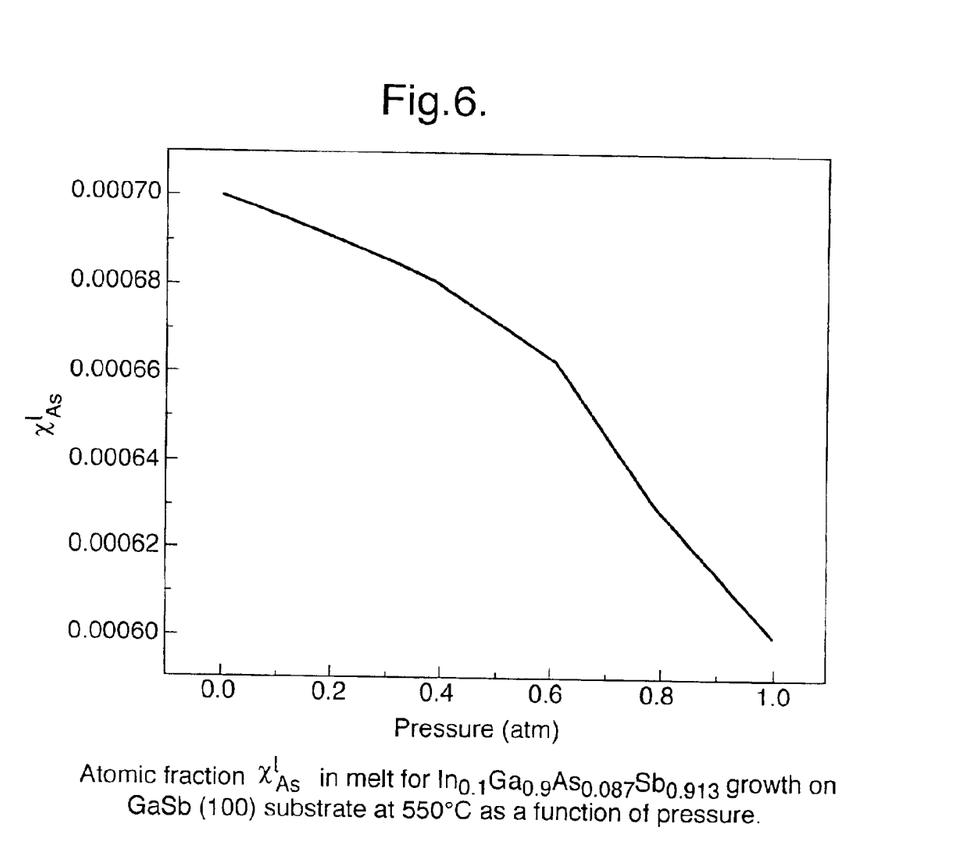
Figure 7:
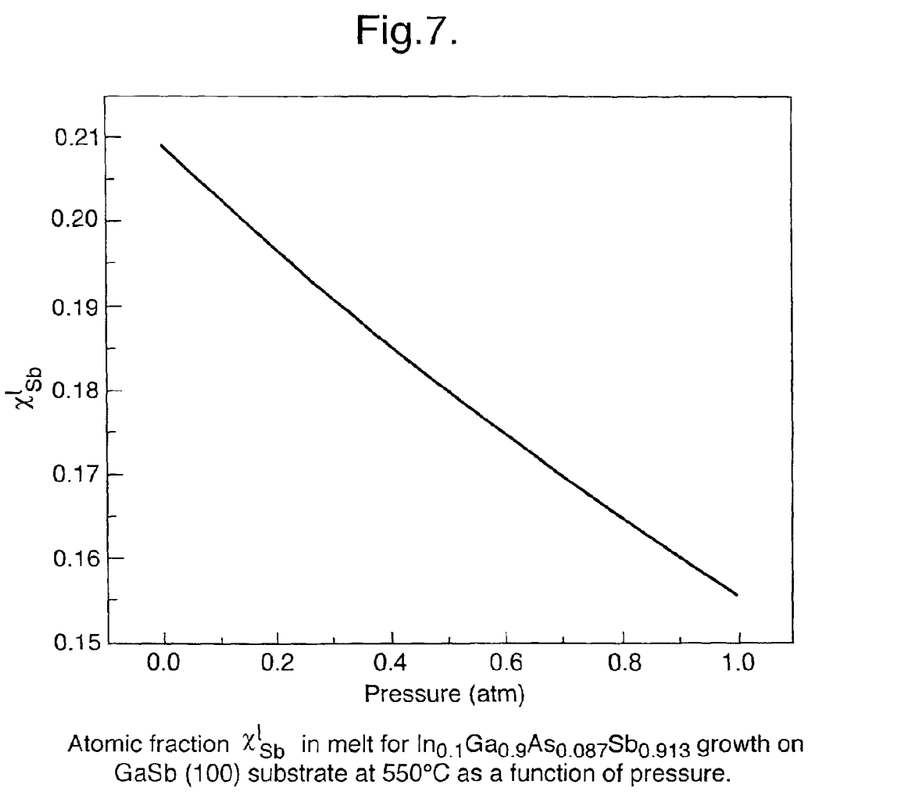

When the pressure increases, the As and Sb content decreases (FIGS. 6 and 7). On the contrary, the In and Ga content increases with an increasing growth pressure (FIGS. 4 and 5). This can be explained as less group V ingredients dissolve in the group III solvent when the pressure increases.

All four curves are monotonous. The phase diagram as a function of temperature in normal LPE is complicated and non-monotonous. A monotonous relationship in variable pressure LPE is beneficial to ingredients control in the solid film.

EXAMPLE 2

FIG. 8 is an illustration of an example of an apparatus suitable for carrying out the invention. The refractory furnace boat 11 comprises a melt chamber 12. The moveable slide 13 is coplanar with the plane of the bottom of the melt chamber 12. A slot 14, at the upper surface of the slide 13 is provided. The slot 14 is large enough to accommodate the substrate 15, with a depth slightly more than the thickness of the substrate. A quantity of growth solution or melt 16 fills part of the melt chamber 12. The entire apparatus is in a pressure chamber 21 and the pressure of the chamber can be varied.

Figure 8A:
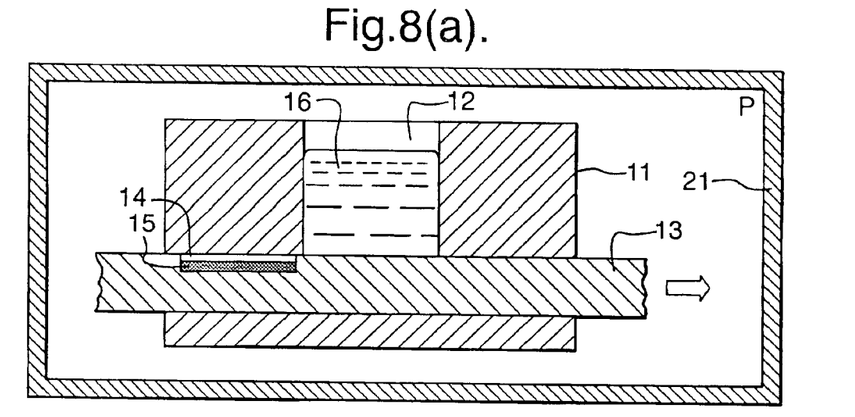
FIG. 8 illustrates part of an apparatus in which variable pressure LPE may be carried out.
Figure 8B:
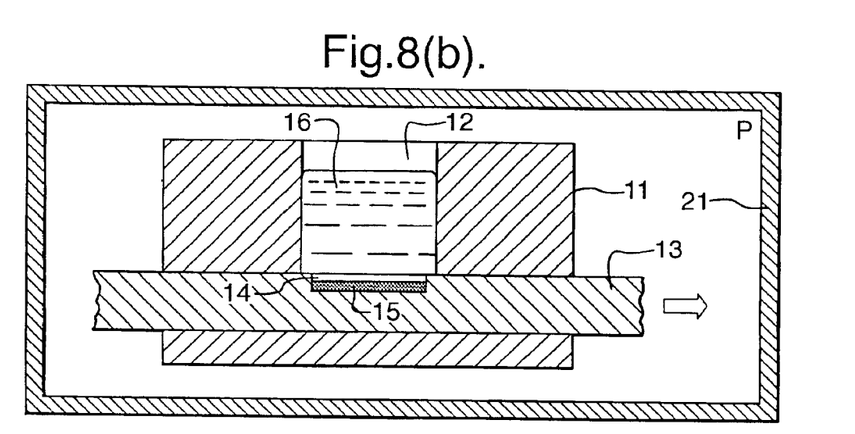
Figure 8C:
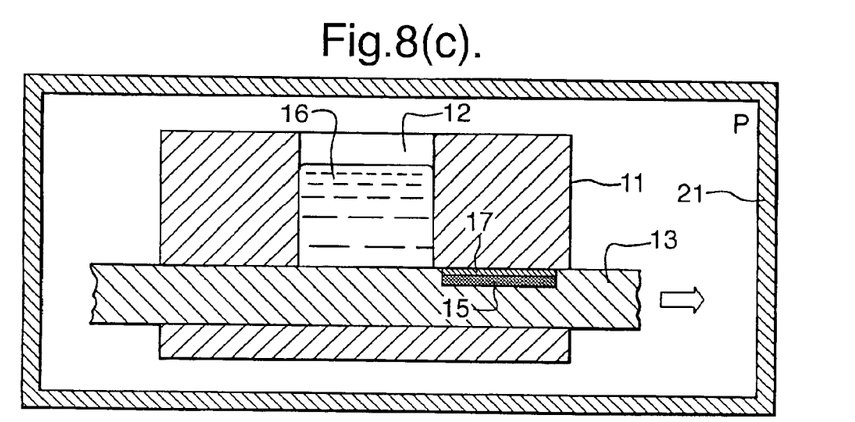

In FIG. 8(a), with the substrate 15 out of the melt region, the pressure is set such that the solution is supersaturated. The pressure depends on the desired composition of the epitaxial layer. In FIG. 8(b), the substrate 15 comes into contact with the growth solution 16 for a controlled period of time. During this period of growth time, the pressure can be varied in order to realise a compositionally graded layer. In FIG. 8(c), the substrate is moved out of the melt region with the epitaxial layer 17 grown.

It is understood that the variable pressure LPE technique is applicable to other LPE growth techniques, such as the dipping technique.

What is claimed is:

1. A method of growing semiconductor epitaxial layers on a substrate in a chamber, said method comprising:
   providing a substrate,
   providing a first growth solution, and
   (i) exposing the substrate to the first growth solution, the growth solution being under a supersaturated condition such that a first epitaxial layer grows on the surface of the substrate; and
   (ii) compositionally grading the first epitaxial layer by varying the pressure in the chamber to change the degree of supersaturation of the first growth solution during epitaxial growth to affect the growth of the first epitaxial layer.

2. A method according to claim 1, further comprising:
   providing the first growth solution and the substrate at atmospheric pressure,
   heating said growth solution to a temperature above its saturation temperature,
   setting a temperature in the chamber at or below the saturation temperature,
   varying the pressure so as to bring the first growth solution to supersaturation, and contacting the substrate with said supersaturated first growth solution so as to deposit material from the growth solution as a solid layer onto the substrate.

3. A method according to claim 1, further comprising: providing the first growth solution and the substrate at atmospheric pressure, heating said first growth solution to a temperature above its saturation temperature, setting a temperature in the chamber at or below the saturation temperature, varying the pressure in the chamber so as to bring the first growth solution to supersaturation, and bringing the substrate into contact with the growth solution.

4. A method according to claim 1, further comprising setting a temperature in the chamber or at least 500° C.

5. A method according to claim 1, further comprising setting the temperature in the chamber at or below the saturation temperature of the first growth solution and maintaining the temperature essentially constant throughout the method.

6. A method according to claim 1, wherein said semiconductor epitaxial layers comprise a system which includes III–V semiconductor epitaxial layers.

7. A method according to claim 1 in which the semiconductor epitaxial layers comprise GaSb.

8. A method according to claim 1, further comprising:
providing one or more further growth solutions, and
(i) exposing the substrate to each of the one or more further growth solutions, the further growth solutions being under a supersaturated condition such that one or more further layers grow on the surface of the first layer; and
(ii) varying a pressure in the chamber to change the degree of supersaturation of each of the one of more further growth solutions to affect the growth of one or more the further layers.

9. A method of growing semiconductor epitaxial layers on a substrate in a chamber, said method comprising:
providing a substrate,
providing a first growth solution, and
(i) exposing the substrate to the first growth solution, the growth solution being under a supersaturated condition such that a first epitaxial layer grows on the surface of the substrate; and
(ii) exposing the substrate to at least one further growth solution, the at least one further growth solution being under a supersaturated condition such that at least one further epitaxial layer grows on the surface of the first epitaxial layer;
wherein the method comprises varying the pressure in the chamber between growth of the first epitaxial layer and exposing the substrate to the at least one further growth solution so as to change the degree of supersaturation of the at least one further growth solution to affect the growth of the at least one further epitaxial layer.

10. A method according to claim 9, further comprising:
providing the first growth solution and the at least second growth solution and the substrate at atmospheric pressure,
heating each of said growth solutions to a temperature above its saturation temperature,
setting a temperature in the chamber at or below the saturation temperature of each growth solution,
varying the pressure in the chamber so as to bring the first growth solution to supersaturation,
contacting the substrate with the supersaturated first growth solution in order to deposit material from the first growth solution as a solid layer onto the substrate,
moving the substrate out of contact with the first growth solution,
varying the pressure in the chamber so as to change the supersaturation of the second growth solution, and
contacting the substrate with the supersaturated second growth solution in order to deposit material from the second growth solution as a solid layer on the first layer.

11. A method according to claim 9, further comprising:
repeating moving the substrate out of contact with a growth solution, varying the pressure so as to change the supersaturation of the further growth solution and contacting the substrate with said supersaturated further growth solution in order to deposit material from said further supersaturated growth solution as a solid layer.

12. A method according to claim 9, further comprising:
providing the first growth solution and at least a second growth solution arid the substrate at atmospheric pressure,
heating each of said growth solutions to a temperature above its saturation temperature,
setting a temperature in the chamber at or below the saturation temperature of each growth solution,
varying the pressure in the chamber so as to bring the first growth solution to supersaturation,
bringing the substrate into contact with the supersaturated first growth solution and varying the pressure in the chamber whilst material is deposited onto the substrate from the first growth solution as a solid layer,
moving the substrate out of contact with the first growth solution,
varying the pressure in the chamber so as to change the supersaturation of the second growth solution, and
bringing the substrate into contact with the supersaturated second growth solution and varying the pressure whilst material is deposited onto the substrate from the second growth solution as a solid layer.

13. A method according to claim 12, further comprising:
repeating moving the substrate out of contact with a growth solution, varying the pressure to change the supersaturation or a further growth solution, contacting the substrate with the supersaturated further growth solution and varying the pressure in the chamber whilst material is deposited onto the substrate from the further growth solution as a solid layer.

* * * * *